(12) United States Patent
Matsubara

(10) Patent No.: US 7,428,177 B2
(45) Date of Patent: Sep. 23, 2008

(54) REFERENCE POTENTIAL GENERATING CIRCUIT AND SEMICONDUCTOR MEMORY DEVICE HAVING THE SAME

(75) Inventor: Yasushi Matsubara, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/723,655

(22) Filed: Mar. 21, 2007

(65) Prior Publication Data

US 2007/0242536 A1    Oct. 18, 2007

(30) Foreign Application Priority Data

Mar. 22, 2006    (JP)    ............... 2006-078287

(51) Int. Cl.
 *G11C 5/14*    (2006.01)
(52) U.S. Cl. ............... 365/189.09; 365/226; 365/169.97
(58) Field of Classification Search ............ 365/189.09, 365/226, 189.07, 189.08, 189.11, 63
See application file for complete search history.

(56) References Cited

U.S. PATENT DOCUMENTS 5,299,154 A * 3/1994 Oowaki et al. ............... 365/149
5,545,977 A * 8/1996 Yamada et al. ............... 323/313
5,969,998 A * 10/1999 Oowaki et al. ......... 365/189.09

FOREIGN PATENT DOCUMENTS

| JP | 7-105682 | 4/1995 |
| JP | 8-190437 | 7/1996 |
| JP | 10-27026 | 1/1998 |

* cited by examiner

*Primary Examiner*—Gene N. Auduong
(74) *Attorney, Agent, or Firm*—McGinn IP Law Group, PLLC

(57) ABSTRACT

A reference potential generating circuit has a current mirror amplifier (CM11) supplied with an input reference potential and a feedback level, an output transistor (QP11) supplied with an output of the current mirror amplifier as an input and producing an output reference potential as an output, a monitoring portion (R11 and R12) for generating the feedback level from the output of the output transistor, a first switch (QN11) for controlling supply of a power supply potential (VSS}) to the current mirror amplifier, a second switch (QN12) for controlling supply of the power supply potential (VSS) to the monitoring portion, and an output switch (TSW12) for controlling connection of the output of the output transistor to a next stage. The first and the second switches and the output switch are simultaneously turned off. When a first predetermined period elapses after the first and the second switches and the output switch are turned off, the first and the second switches are turned on. When a second predetermined period elapses after the first and the second switches are turned on, the output switch is turned on.

19 Claims, 5 Drawing Sheets

US 7,428,177 B2

REFERENCE POTENTIAL GENERATING CIRCUIT AND SEMICONDUCTOR MEMORY DEVICE HAVING THE SAME

This application claims priority to prior Japanese patent application JP2006-78287, the disclosure of which is incorporated herein by reference.

BACKGROUND OF THE INVENTION

This invention relates to a reference potential generating circuit and a semiconductor memory device having the reference potential generating circuit.

In recent years, a mobile apparatus such as a mobile phone becomes more and more multifunctional and a memory device mounted to the mobile apparatus is increased in capacity. Because the mobile apparatus has a compact size, a semiconductor memory device is used as the memory device for use in the mobile apparatus. For example, in the mobile phone, a flash memory (Flash EEPROM: Flash Electrically Erasable Programmable Read Only Memory) is used as a nonvolatile memory device for storing data such as telephone numbers which are desired to be retained even if a power supply is turned off. Further, as a main memory device, a DRAM (Dynamic Random Access Memory) is used because of its low cost and large capacity. The DRAM mounted to the mobile apparatus is called a mobile DRAM.

Needless to say, power is supplied to the mobile phone during speech communication. Moreover, even when the mobile phone is unused and is ready for call transmission or call reception, a power supply voltage is supplied to the mobile phone and an electric current is consumed. The above-mentioned state where the mobile phone is ready for call transmission or call reception is called a standby state. For the most part of time, the mobile phone is in the standby state ready for call transmission or call reception than in a speech communication state. When the mobile phone is in the standby state, the mobile DRAM requires a refresh operation in order to retain stored data. The stored data of the DRAM is electric charges stored in a capacitance portion of a memory cell. The electric charges stored in the memory cell attenuate with lapse of time and are lost unless rewriting is performed at every predetermined time interval. Therefore, the refresh operation for rewriting the stored data is required. In the standby state which occupies the most part of time in the mobile phone, the electric current is consumed only by the refresh operation. Thus, it is desired to reduce the electric current in the standby state.

The refresh operation in the standby state is automatically performed inside a DRAM circuit without control of a CPU (Central Processing Unit) circuit. Automatic refresh operation inside the DRAM circuit is called a self-refresh operation. In the self-refresh operation, a timer circuit in the DRAM automatically generates a refresh command at every predetermined time interval to continuously activate a word line. A sense amplifier reads data and rewrites the data in the memory cell. As mentioned above, in the standby state of the mobile phone, the refresh operation is performed in the DRAM in order to retain the data stored therein. Therefore, in order to increase an operation time of a battery of the mobile phone, it is very important to reduce the electric current consumed in the refresh operation in the standby state.

The electric current required in the self-refresh operation is a total electric current consumed by generation of the refresh operation at every predetermined time interval. A constant or predetermined electric current is consumed in each single refresh operation. Therefore, the longer a cycle (i.e., the above-mentioned predetermined time interval) of the refresh operation is, the less self-refresh current is required.

A value of the refresh current changes depending on a temperature of the semiconductor memory device. Specifically, a cycle (i.e., the predetermined time interval) in which the above-mentioned timer circuit in the DRAM generates the refresh command, changes with the temperature. As the temperature becomes higher, the cycle is shortened, i.e., the refresh current increases. To the contrary, as the temperature becomes lower, the cycle is lengthened, i.e., the refresh current decreases. For a 512 Mbit DRAM, an actual self-refresh current value is approximately 800 µA at 85° C. and 530 µA at 45° C. Further, for a 256 Mbit DRAM, an actual self-refresh current value is approximately 400 µA at 85° C. and 270 µA at 45° C. For a 128 Mbit DRAM, an actual self-refresh current value is approximately 200 µA at 85° C. and 140 µA at 45° C. Thus, the value of the entire self-refresh current is on the order of several tens to several hundreds microampere.

The self-refresh current includes not only an electric current used in charging and discharging the word line and a bit line as the refresh operation but also an electric current constantly and continuously consumed. The latter electric current is called a through current or a DC current and mostly consumed in a reference potential generating circuit. The reference potential generating circuit is a circuit for generating an internal reference potential, such as a reference potential VDL as a writing voltage of a memory cell array, a precharging reference potential VDL/2, and a sense amplifier operation reference potential VSP/VSN. The DC current consumed in the reference potential generating circuit will be described hereinunder.

The reference potential generating circuit generally comprises a current mirror amplifier, an output transistor, and a monitoring resistance element portion. The current mirror amplifier compares an input reference potential and a feedback level received from the monitoring resistance element portion and makes the output transistor generate an output reference potential. In the reference potential generating circuit, the current mirror amplifier continuously performs comparison and judgment for an input potential. Further, the monitoring resistance element portion is a group of resistors connected between the output reference potential and a ground potential. Therefore, a stationary DC current flows through the current mirror amplifier and the monitoring resistance element portion.

The DC current is characterized in that a substantially-constant current continuously flows, and is therefore independent from the above-mentioned self-refresh cycle. Generally, a plurality of current mirror amplifiers and a plurality of monitoring resistance element portions are present inside the DRAM at a plurality of parts, several to several tens in number. Each part is supplied with an electric current of approximately 3 to 10 µA. Therefore, assuming that an electric current of 4 µA is supplied to each of 15 parts, the DC current of approximately 60 µA in total is required in the entire mobile DRAM. In this case, for the 256 Mbit DRAM, the DC current occupies approximately 22% of the self-refresh current of 270 µA at 45° C. For the 128 Mbit DRAM, the DC current occupies approximately 43% of the self-refresh current of 140 µA at 45° C.

It is understood that, in order to reduce the self-refresh current, the DC current must be reduced also with a priority equivalent to extension of the refresh cycle.

In FIG. 1, a reference potential generating circuit having a two-stage structure is shown as a related art. The reference potential generating circuit has a first-stage reference potential generating circuit supplied with an input reference potential VREF_0 for generating an output reference potential VREF_A and a second-stage reference potential generating circuit supplied with VREF_A as an input reference potential VREF_B for generating an output reference potential VREF_C. The output reference potential VREF_C is used as an input reference potential VREF_D at a next stage. The first-stage reference potential generating circuit has a current mirror amplifier CM11, an output transistor (P-channel transistor) QP11, and resistance elements R11 and R12 constructing a monitoring resistance element portion. A capacitance element C11 retains VREF_A as the input reference potential VREF_B. The second-stage reference potential generating circuit has a current mirror amplifier CM12, an output transistor (P-channel transistor) QP12, and resistance elements R13 and R14 as a monitoring resistance element portion. A capacitance element C12 retains VREF_C as an input reference potential VREF_D at a next stage.

In FIG. 15 of Japanese Unexamined Patent Application Publication (JP-A) No. H10-27026 (Patent Document 1), an internal power supply potential supplying circuit is disclosed. In the internal power supply potential supplying circuit, when a control signal SC1 has an "L" level, a comparator 1 is put into an inactive state to stop an output S1 and a transistor Q4 is turned off (see paragraphs [0104] and [0106] of Patent Document 1).

In the abstract of Japanese Unexamined Patent Application Publication (JP-A) No. H7-105682 (Patent Document 2), a dynamic memory using an internal step-down power supply is disclosed. The dynamic memory is provided with a plurality of (three) internal step-down power supplies. One of the power supplies is always turned on while the other two power supplies are turned off at least in a standby time and turned on in a time period (active time period) except for the standby time.

In FIG. 15 of Japanese Unexamined Patent Application Publication (JP-A) No. H8-190437 (Patent Document 3), an internal power supply voltage generating circuit is disclosed. In the internal power supply voltage generating circuit, n-channel MOS transistors N5 and N6 are connected between a comparison circuit 3 and the ground (VSS) and between a resistance element Z2 and the ground (VSS). The n-channel MOS transistors N5 and N6 are turned into an off state when a period control signal EN has an L level as an inactive state (see paragraphs [0077] and [0075] of Patent Document 3).

As mentioned above, the DC current flows through the current mirror amplifier and the monitoring resistance element portion. The current mirror amplifier and the output transistor perform a negative feedback operation by receiving an input reference potential as a minus input and a feedback level received from the monitoring resistance element portion as a plus input. The current mirror amplifier judges whether the feedback level is higher or lower than the input reference potential. In response to the result of judgment, the output transistor controls an output reference potential to a predetermined target value. In case where the feedback level is higher than the input reference potential, the output reference potential is lowered and in case where the feedback level is lower than the input reference potential, the output reference potential is elevated. Thus, the output reference potential is controlled.

In a portion of the current mirror amplifier where the input reference potential and the feedback level is compared and judged and in the monitoring resistance element portion, an almost constant DC current always and continuously flows. The DC current occupies 20 to 40% of the self-refresh current corresponding to a standby current of the mobile DRAM.

The remaining part, i.e., 60 to 80% of the self-refresh current includes charging and discharging currents associated with the refresh operation and a defective leak current undesirably generated inside the mobile DRAM. As a matter of course, efforts are continued to reduce the remaining current accompanied with the refresh operation and the defective leak current. However, with respect to the DC current on which the present invention focuses attention, no discussion has been actively made because a ratio of the DC current with respect to the total self-refresh current is not so large as the present ratio of 20 to 40%.

At present, however, the reduction of the DC current is becoming a significant object. Specifically, the DC current of about 60 to 100 μA is desired to be reduced to a half or less, i.e., 30 to 50 μA.

Further, it is also an object to generate a stable output reference potential in the reference potential generating circuit. In the internal power supply potential supplying circuit of the above-mentioned Patent Document 1, even if the control signal SC1 is turned into an "H" level and the comparator is put into an active state, the comparator does not instantaneously perform a stable operation. Therefore, at the beginning of the active state of the comparator, the output reference potential of the internal power supply potential supplying circuit inevitably becomes unstable. The internal step-down power supply of the above-mentioned Patent Document 2 also has a comparator. Like in the internal power supply potential supplying circuit of the above-mentioned Patent Document 1, an output reference potential of the internal step-down power supply becomes unstable. The internal power supply voltage generating circuit of the above-mentioned Patent Document 3 also has a comparison circuit. Like in the internal power supply potential supplying circuit of the above-mentioned Patent Document 1, an output reference potential of the internal power supply voltage generating circuit becomes unstable.

SUMMARY OF THE INVENTION

It is therefore an object of the present invention to provide a reference potential generating circuit capable of reducing the DC current mentioned above and generating a stable output reference potential.

It is another object of the present invention to provide a semiconductor memory device having a reference potential generating circuit capable of reducing the DC current and generating a stable output reference potential.

A reference potential generating circuit according to the present invention and a semiconductor memory device according to the present invention are as follows.

(1) A reference potential generating circuit supplied with an input reference potential for generating an output reference potential, the circuit comprising a current mirror amplifier supplied with the input reference potential and a feedback level, an output transistor supplied with an output of the current mirror amplifier as an input for producing the output reference potential as an output, a monitoring portion for generating the feedback level from the output of the output transistor, a first switch for controlling power supply to the current mirror amplifier, a second switch for controlling power supply to the monitoring portion, and an output switch for controlling connection of the output of the output transistor to a next stage, the first and the second switches and the output switch being simultaneously turned off, the first and the second switches being turned on when a first predetermined period elapses after the first, the second, and the output switches are turned off, the output switch being turned on when a second predetermined period elapses after the first and the second switches are turned on.

(2) The reference potential generating circuit as described in the above-mentioned (1), wherein the monitoring portion has a plurality of resistance elements connected in series and is for generating the feedback level at a resistance division point by the resistance elements, the first and the second switches comprising transistors, respectively, the output switch comprising a transfer switch.

(3) The reference potential generating circuit as described in the above-mentioned (1), wherein the first switch is for controlling supply of the ground potential to the current mirror amplifier and the second switch is for controlling supply of the ground potential to the monitoring portion.

(4) The reference potential generating circuit as described in the above-mentioned (1), wherein the second predetermined period includes a period from a time instant when the first and the second switches are turned on to a time instant when ringing caused in the output of the output transistor by the current mirror amplifier converges and the output of the output transistor becomes stable.

(5) The reference potential generating circuit as described in the above-mentioned (1), further comprising a control portion for controlling the first and the second switches and the output switch, the control portion repeatedly performing an operation of simultaneously turning off the first and the second switches and the output switch in a predetermined cycle, the control portion turning on the first and the second switches in each predetermined cycle after lapse of the first predetermined period from a time instant when the first and the second switches and the output switch are simultaneously turned off, the control portion turning on the output switch after lapse of the second predetermined period from a time instant when the first and the second switches are turned on, and keeping the first and the second switches and the output switch in an on state during a third predetermined period after the output switch is turned on and before the first and the second switches and the output switch are simultaneously turned off next time.

(6) The reference potential generating circuit as described in the above-mentioned (1), further comprising a subsequent-stage reference potential generating circuit supplied with the output reference potential as a subsequent-stage input reference potential for generating a subsequent-stage output reference potential, the subsequent-stage reference potential generating circuit comprising a resistance dividing portion for dividing a potential between the subsequent-stage input reference potential and a power supply potential by a plurality of resistances to generate the subsequent-stage output reference potential, a third switch for controlling supply of the subsequent-stage input reference potential to the resistance dividing portion, a fourth switch for controlling supply of the power supply potential to the resistance dividing portion, and a fifth switch for controlling connection of the subsequent-stage output reference potential of the resistance dividing portion to a next stage, the third through the fifth switches being simultaneously turned off, the third and the fourth switches being turned on when the first predetermined period elapses after the third through the fifth switches are simultaneously turned off, the fifth switch being turned on when the second predetermined period elapses after the third and the fourth switches are turned on.

(7) The reference potential generating circuit as described in the above-mentioned (6), wherein each of the third and the fifth switches comprises a transfer switch, the fourth switch comprising a transistor.

(8) The reference potential generating circuit as described in the above-mentioned (6), wherein the fourth switch is for controlling supply of the ground potential to the resistance dividing portion.

(9) A semiconductor memory device comprising the reference potential generating circuit described in any one of the above-mentioned (1) through (8).

(10) A semiconductor memory device comprising the reference potential generating circuit described in the above-mentioned (5), the semiconductor memory device further comprising a self-refreshing timer circuit for generating a refresh command in a self-refresh cycle, the control portion being connected to the self-refreshing timer circuit and determining the predetermined cycle on the basis of the refresh command supplied from the self-refreshing timer circuit.

(11) The semiconductor memory device as described in the above-mentioned (10), wherein the control portion further determines the first through the third predetermined periods on the basis of the refresh command.

(12) The semiconductor memory device as described in the above-mentioned (10), wherein a self-refresh operation is performed in the third predetermined period.

In the reference potential generating circuit of the present invention, in the standby state, the first to the third switches are turned off to put the reference potential generating circuit into a stop state, so that a DC current is reduced and current consumption is reduced. When the reference potential generating circuit performs an operation, the first and the second switches are first turned on to put the current mirror amplifier and the output transistor into an active state and it is waited that an output potential of the output transistor becomes stable. At the time instant when the output potential becomes stable, the third switch is turned on and the output potential of the output transistor is transmitted to a next stage. Thus, it is possible to obtain the reference potential generating circuit capable of reducing current consumption in the standby state and obtaining a stable reference potential when an operation is performed (for example, upon a refresh operation in case where the reference potential generating circuit is used in a semiconductor memory device).

Thus, according to the present invention, it is possible to obtain the reference potential generating circuit capable of reducing a DC current and generating a stable output reference potential.

Further, according to the present invention, it is possible to obtain the semiconductor memory device having the reference potential generating circuit capable of reducing a DC current and generating a stable output reference potential.

DESCRIPTION OF THE PREFERRED EMBODIMENTS

Figure 1:
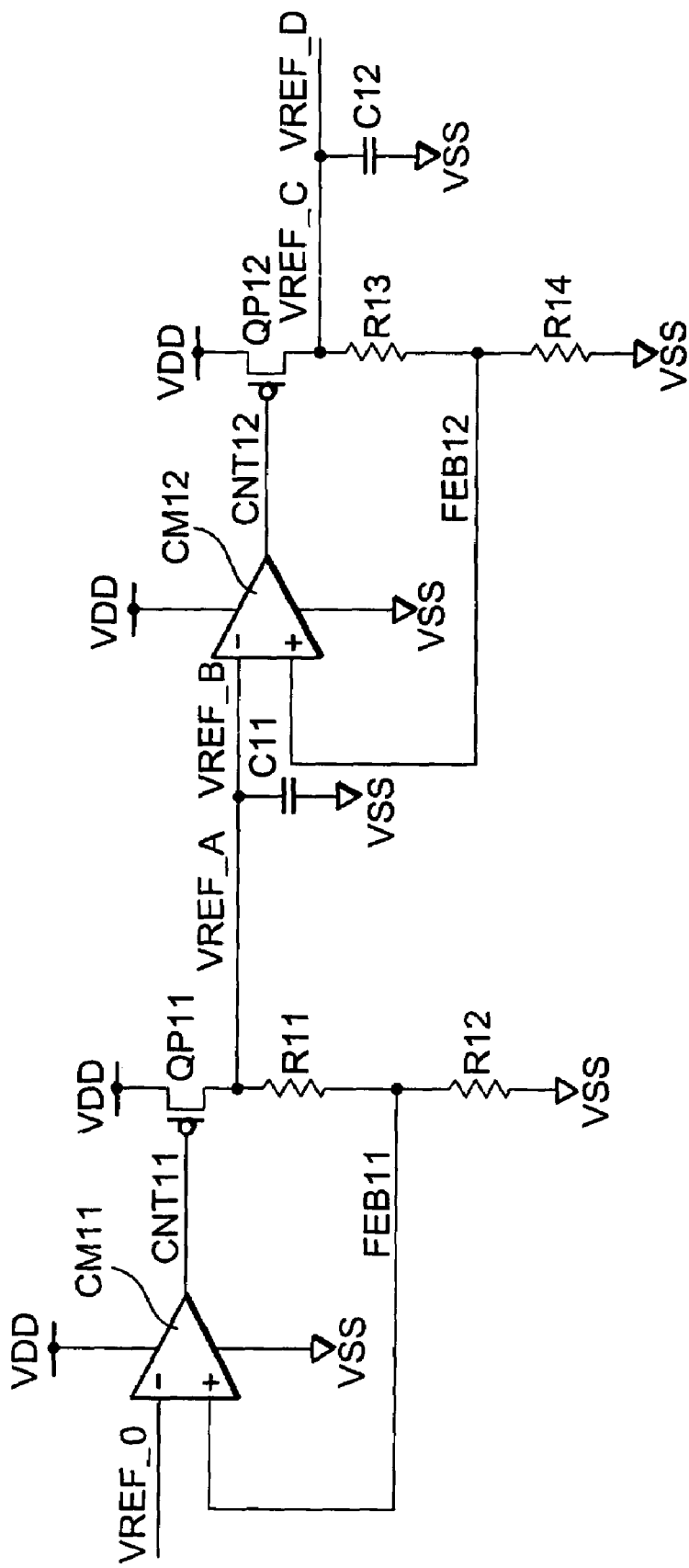
FIG. 1 is a view showing a reference potential generating circuit having a two-stage structure as a related art.

Now, referring to the drawing, embodiments of the present invention will be described.

First Embodiment

Figure 2:
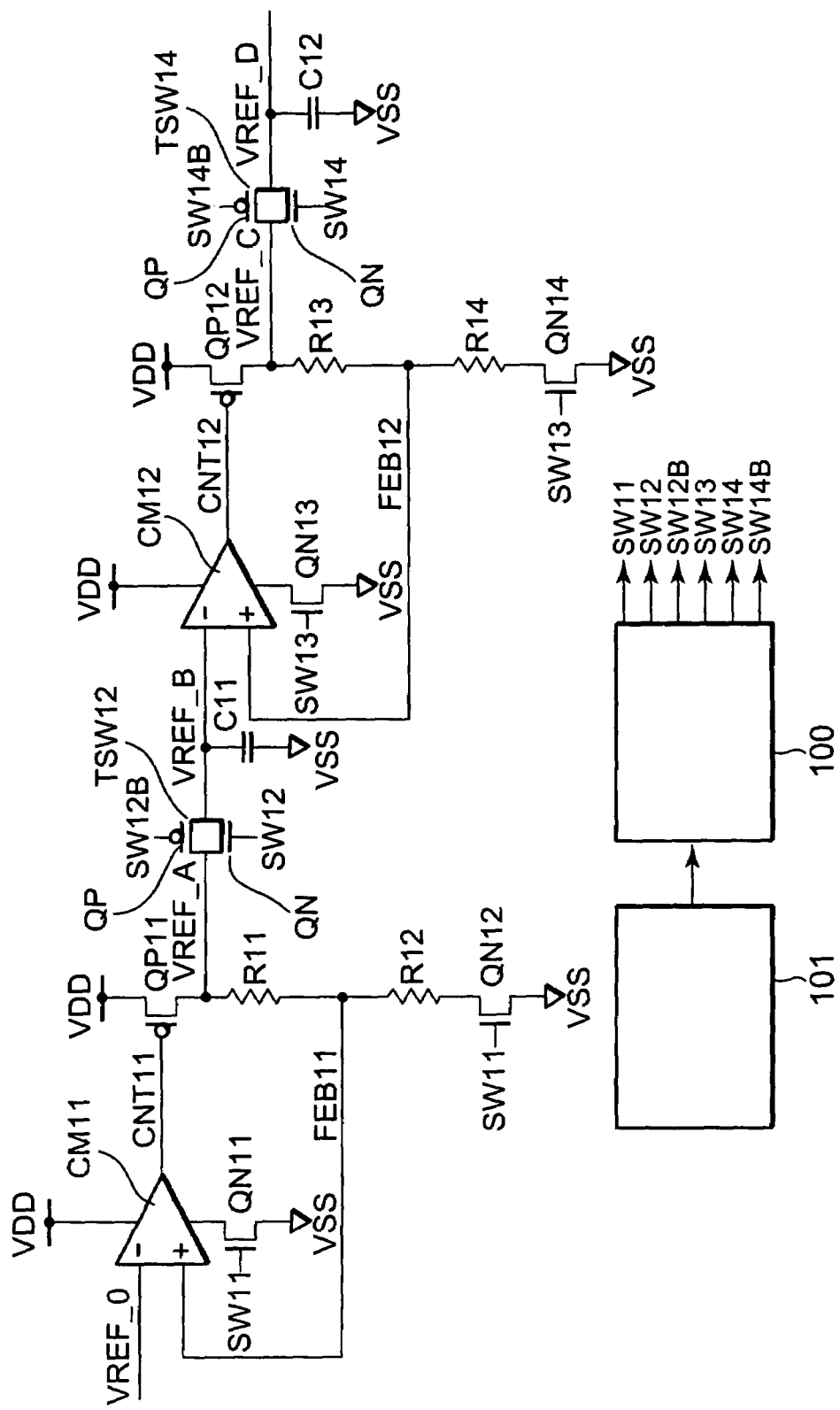
FIG. 2 is a view showing a DC current reduction-type reference potential generating circuit according to a first embodiment of the present invention.
Figure 3:
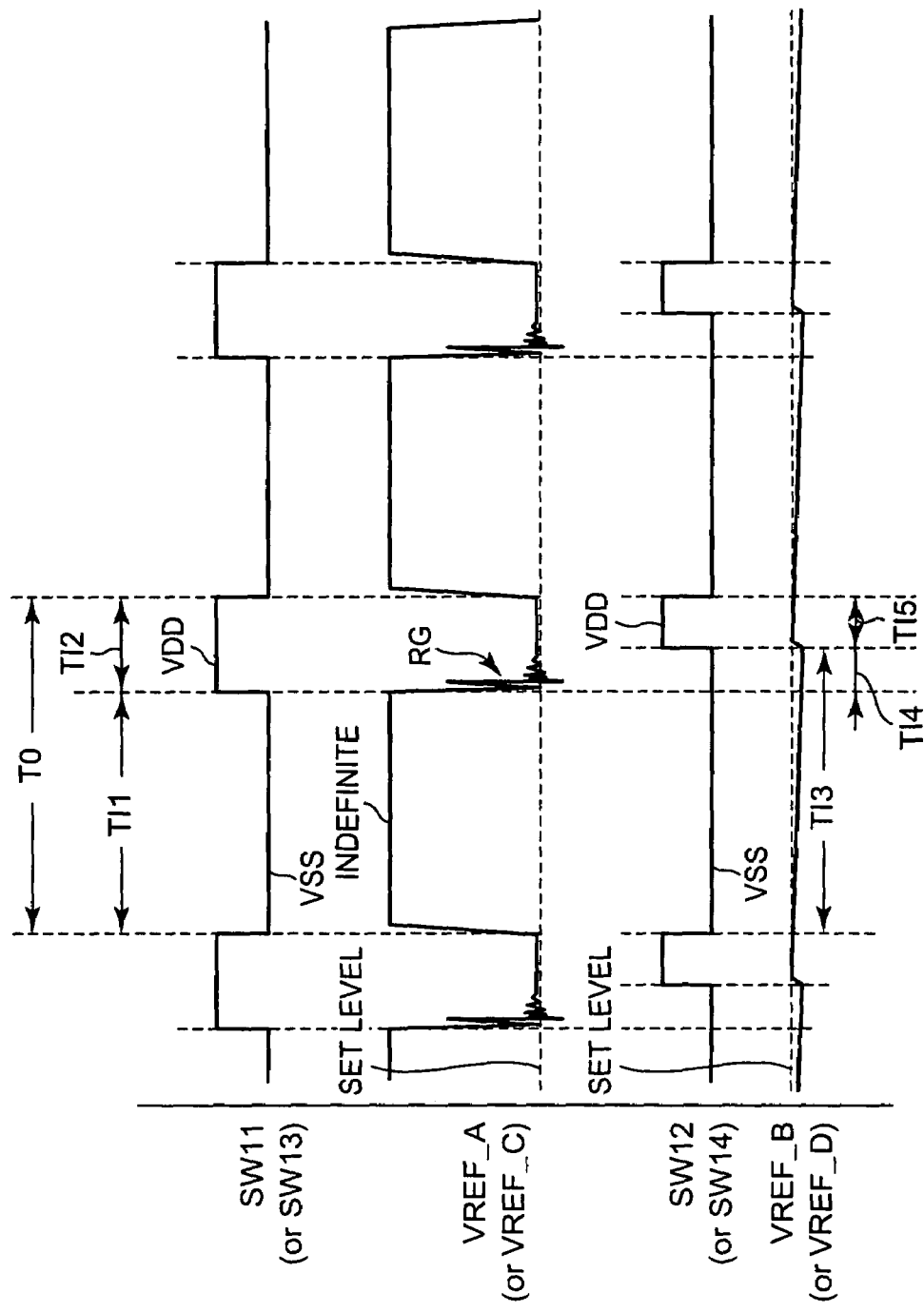
FIG. 3 is a timing chart for describing an operation of the DC current reduction-type reference potential generating circuit in FIG. 2.

Referring to FIGS. 2 and 3, a DC current reduction-type reference potential generating circuit according to a first embodiment of the present invention will be described. The DC current reduction-type reference potential generating circuit is used in a semiconductor memory device. As shown in FIG. 2, the DC current reduction-type reference potential generating circuit has a first-stage reference potential generating circuit supplied with an input reference potential VREF_0 for generating an output reference potential VREF_A and a second-stage reference potential generating circuit supplied with VREF_A as an input reference potential VREF_B for generating an output reference potential VREF_C.

In the first-stage reference potential generating circuit, a current mirror amplifier CM11 is supplied with the input reference potential VREF_0 as a minus-side input and a feedback level FEB11 as a plus-side input. The input reference potential VREF_0 is generated by another circuit different from the circuit in FIG. 2 and is an intermediate potential. For example, VREF_0 is 0.6V with respect to a power supply potential VDD of 1.8V. The input reference potential VREF_0 is a signal which always has a constant level regardless of time. The current mirror amplifier CM11 is supplied with a power supply potential VDD and a ground potential VSS. Between the current mirror amplifier CM11 and the ground potential VSS, a current switch (first switch) comprising an N-channel transistor QN11 is connected. The current switch (first switch) QN11 controls supply of the power supply potential VSS to the current mirror amplifier CM11. The N-channel transistor QN11 is controlled by a current switch signal SW11 to be turned on or off. When the current switch signal SW11 has a low level, the N-channel transistor QN11 is turned off. When the N-channel transistor QN11 is turned off, no electric current flows through the current mirror amplifier CM11 from VDD to VSS. The current mirror amplifier CM11 produces an output CNT11 which is supplied to a gate of a P-channel transistor QP11 (output transistor).

The output VREF_A of the P-channel transistor QP11 is connected to the ground potential VSS via resistance elements R11 and R12 and an N-channel transistor QN12. The output VREF_A is subjected to resistance division by the resistance elements R11 and R12 and a division point is the feedback level FEB11. For example, the resistance elements R11 and R12 have resistance values equal to each other (R11=R12) and the feedback level FEB11 as an internally dividing point has a value corresponding to a half of that of VREF_A. The feedback level FEB11 is, as a feedback input, connected to the plus-side input of the current mirror amplifier CM11. The resistance elements R11 and R12 constitute a monitoring portion (monitoring resistance element portion) for generating the feedback level FEB11 from an output of the P-channel transistor QP11 (output transistor). Between the resistance element R12 and the ground potential VSS, the N-channel transistor QN12 is connected as a current switch (second switch). The current switch (second switch) QN12 controls supply of the power supply potential VSS to the monitoring portion (R11 and R12). The above-mentioned current switch signal SW11 is supplied to a gate of the current switch QN12. When the current switch QN12 is turned off, no electric current flows through a path of the resistance elements R11 and R12.

The output VREF_A of the P-channel transistor QP11 (output transistor) is further connected to VREF_B through a transfer switch (output switch) TSW12. VREF_B is an output reference potential of the first-stage reference potential generating circuit and is used as the input reference potential of the second-stage reference potential generating circuit. Specifically, the transfer switch (output switch) TSW12 controls connection of the output VREF_A of the P-channel transistor QP11 (output transistor) to a next stage. The transfer switch TSW12 comprises a combination of an N-channel transistor QN and a P-channel transistor QP. The N-channel transistor QN has a gate supplied with an output switch signal SW12. The P-channel transistor QP has a gate supplied with an output switch signal SW12B. The output switch signals SW12 and SW12B are reverse in polarity to each other. When one of the output switch signals SW12 and SW12B has a VDD level, the other has a VSS level. The transfer switch TSW12 is turned conductive or nonconductive in response to the output switch signals SW12 and SW12B.

The input reference potential VREF_B is connected to one end of a capacitance element C11. The other end of the capacitance element C11 is connected to VSS. Therefore, the capacitance element C11 has capacitance on the order of several hundreds fF (femto Farad) to several pF (pico Farad).

In the second-stage reference potential generating circuit, a current mirror amplifier CM12 is similar in structure to the above-mentioned current mirror amplifier CM11 and is supplied with the input reference potential VREF_B as a minus-side input and a feedback level FEB12 as a plus-side input. An N-channel transistor QN13 as a current switch has a gate supplied with a current switch signal SW 13. The current switch QN13 controls supply of a power supply potential VSS to the current mirror amplifier CM12. Thus, the N-channel transistor QN13 functions as a first switch like the N-channel transistor QN11. Therefore, the N-channel transistor QN13 is called the first switch of the second-stage reference potential generating circuit. The current mirror amplifier CM12 produces an output CNT12 which is supplied to a gate of a P-channel transistor (output transistor) QP12. The output VREF_C of the P-channel transistor QP12 is connected to the ground potential VSS via resistance elements R13 and R14 and an N-channel transistor QN14. An internally dividing point of resistance division of the output VREF_C by the resistance elements R13 and R14 is the feedback level FEB12. The feedback level FEB12 is connected to a minus input of the current mirror amplifier CM12 as a feedback input. The resistance elements R13 and R14 constitute a monitoring portion for generating the feedback level FEB12 from an output of the P-channel transistor QP12 (output transistor). The N-channel transistor QN14 as a current switch (second switch) has a gate supplied with the above-mentioned current switch signal SW13. The current switch QN14 controls supply of the power supply potential VSS to the monitoring portion (R13 and R14). Thus, the N channel transistor QN14 functions as a second switch like the N-channel transistor QN12. Therefore, the N-channel transistor QN14 is called the second switch of the second-stage reference potential generating circuit.

The output VREF_C of the P-channel transistor QP12 (output transistor) is a reference potential having a predetermined potential and obtained as a result of comparison and judgment between the input reference potential VREF_B and the feedback level FEB12. The output reference potential VREF_C is connected to a reference potential VREF_D through a transfer switch (output switch) TSW14. The reference potential VREF_D is used as an input to an internal circuit (not shown). Thus, the transfer switch (output switch) TSW14 controls connection of the output VREF_C of the P-channel transistor QP12 (output transistor) to a next stage. The transfer switch TSW14 is similar in structure to the above-mentioned transfer switch TSW12. Complementary signals SW14 and SW14B reverse in polarity to each other are supplied to an N-channel transistor QN and a P-channel transistor QP, respectively. To the reference potential VREF_D, a capacitance element C12 is connected.

The switch signals SW11, SW13, SW12, and SW14 are generated by a control portion 100 on the basis of signals supplied from a cycle generating circuit 101 for generating the signals in a predetermined cycle. For example, the cycle generating circuit 101 is a self-refreshing timer circuit in a semiconductor memory device. In the following description, the cycle generating circuit is a self-refreshing timer circuit 101.

Specifically, the DC current reduction-type reference potential generating circuit in FIG. 2 is mounted to a semiconductor memory device having the self-refreshing timer circuit 101 for generating a refresh command in a self-refresh cycle. The DC current reduction-type reference potential generating circuit further comprises the control portion 100 for controlling the first switches QN11 and QN13, the second switches QN12 and QN14, and the output switches TSW12 and TSW14. The control portion 100 is connected to the self-refreshing timer circuit 101 and, on the basis of refresh commands received from the self-refreshing timer circuit 101, produces the current switch signal SW11, the output switch signals SW12 and SW12B, the current switch signal SW13, and the output switch signals SW14 and SW14B.

Next, referring to a timing chart in FIG. 3 in addition to FIG. 2, an operation of the embodiment in FIG. 2 will be described. In FIG. 3, the current switch signal SW11 (or SW13), the output reference potential VREF_A (or VREF_C), the current switch signal SW12 (or SW14), and the input reference potential VREF_B (or VREF_D) are shown.

The arrangement of the current mirror amplifier CM12, the output transistor QP12, the monitoring resistance element portions (R13 and R14), the current switches QN13 and QN14, the output switch TSW14, and the capacitance C12 in the second-stage reference potential generating circuit is identical with that from the current mirror amplifier CM11 to the capacitance C11 in the first-stage reference potential generating circuit. Further, the inputs and the outputs of the second-stage reference voltage generating circuit are similar to those of the first-stage reference voltage generating circuit except that the input reference potential is changed from VREF_0 to VREF_B and the output reference potential is changed from VREF_A to VREF_C. Therefore, an operation of the second-stage reference potential generating circuit will readily be understood from the description of the operation of the first-stage reference potential generating circuit and detailed description thereof will be omitted herein. Hereinafter, only the operation of the first-stage reference potential generating circuit will be described.

The first-stage reference potential generating circuit performs the following basic operation in case where all of the first and the second switches QN11 and QN12 and the output switch TSW12 are turned on. Specifically, the current mirror amplifier CM11 compares the feedback level FEB11 and the input reference potential VREF_0. In case where the feedback level FEB11 is higher than the input reference potential VREF_0, a potential of the output CNT11 of the current mirror amplifier CM11 increases. To the contrary, in case where the feedback level FEB11 is lower than the input reference potential VREF_0, the potential of CNT11 decreases. The gate of the P-channel transistor QP11 is supplied with CNT11. The P-channel transistor QP11 performs negative feedback control to decrease the feedback level FEB11 if FEB11 increases and to increase FEB11 if FEB11 decreases.

In case where the level of the current switch signal SW11 is decreased to the VSS level at a particular time instant as shown in FIG. 3, the current switches (first and second switches) QN11 and QN12 are turned off and the electric current flowing through the current mirror amplifier CM11 and the output transistor QP11 is stopped. The electric current supplied to the reference potential generating circuit is "zero" ampere. In this state, no electric current flows and the reference potential generating circuit is in a state where the operation is stopped. Therefore, this period is represented by a STOP period TI1. In this case, VREF_A as the output of the P-channel transistor QP11 has an indefinite (or undefined) level (floating level) as a result of stopping the electric current. It is assumed that VREF_0 is 0.6V, VDD is 1.8V, and a set level of VREF_A (and VREF_B) is 1.2V It is also assumed that VREF_A is 1.2V before the electric current is stopped and that VREF_A is elevated to a high level when the current switches QN11 and QN12 are turned off. In this case, assuming that an electric current of 10 μA in total flows through the current mirror amplifier CM11 and the P-channel transistor QP11, the electric current is reduced by 10 μA by turning off the current switches (first and second switches) QN11 and QN12.

Further, at the same time when the current switches (first and second switches) QN11 and QN12 are turned off, the level of the output switch signal SW12 is also decreased to the VSS level (the level of the output switch signal SW12B is increased to the VDD level) as shown in FIG. 3. As a consequence, the transfer switch TSW12 is also turned off. That is, VREF_A and VREF_B are isolated and disconnected. The potential VREF_B retains 1.2V (set level) which is a potential before isolation and when the capacitance element C11 is charged. Actually, however, VREF_B is decreased in potential by a minute leak current. The potential is given by:

$$V(t)=Q(t)/C,$$

where V(t) represents the potential of VREF_B, Q(t), the charge amount of C11, and C, the capacitance value of C11. It is assumed here that C11 is substantially larger than a parasitic capacitance of a wiring VREF_B.

After lapse of the predetermined period TI1, the current switch signal SW11 has the VDD level and the current switches QN11 and QN12 are turned on (ACTIVE). The reference potential generating circuit is supplied with an electric current and an operation is started. Therefore, this period is represented by an ACTIVE period TI2. Further, the ACTIVE period TI2 comprises a predetermined period TI4 in which the transfer switch (output switch) TSW12 is in an off state and a predetermined period TI5 in which the output switch TSW12 is in an on state.

During the predetermined period TI4, the transfer switch (output switch) TSW12 is kept in an off state. At a starting point of the predetermined period TI4, the potential of VREF_B has a value decreased, for example, by 20 mV than an initial value (set level). This potential change is mainly caused by leak in diffusion layer regions of the transistors of the transfer switch. Therefore, the decrease in voltage is no more than about 20 mV in a range of a refresh cycle (which will be later described). An appropriate time interval within a time range not exceeding the refresh cycle is selected and the current switches QN11 and QN12 are turned on (ACTIVE). The potential of VREF_B is further decreased until a time instant when the transfer switch TSW12 is turned on (CONNECT). However, the decrease of the potential of VREF_B is very small and causes no problem. Specifically, a time instant when the transfer switch TSW12 is turned on (CONNECT) is delayed by a certain time period (depicted at TI4 in FIG. 3) from a time instant when the current switches QN11 and QN12 are turned on (ACTIVE). This is one of characteristics of the present invention.

When the level of the current switch signal SW11 is increased up to the VDD level, the current switches QN11 and QN12 are turned on. As a consequence, an electric current flows through the current mirror amplifier CM11, the output transistor QP11, and the monitoring portion R11 and R12 to put the feedback level FEB11 into an operating state. The current mirror amplifier CM11 exhibits an unstable behavior immediately after the level of the current switch signal SW11 is increased to the VDD level. The output CNT11 of the current mirror amplifier CM11 is varied in potential in response to the feedback level FEB11.

However, immediately after the level of the current switch signal SW11 is increased up to the VDD level, a desired operation described as the above-mentioned basic operation is not effected until a time instant when each of internal nodes of the current mirror amplifier CM11 is stabilized at a desired potential. Further, since the potential change of the feedback level FEB11 drastically occurs, control of the current mirror amplifier CM11 is temporally delayed. As a result, ringing occurs in VREF_A. However, the ringing is converged by the negative feedback and VREF_A is finally stabilized. In FIG. 3, the ringing is shown as RG in VREF_A. Since the feedback level FEB11 is obtained by the resistance division of VREF_A, ringing occurs in VREF_A and the feedback level FEB11 almost in synchronization with each other. Therefore, the operation is unstable during the period TI4 and the output potential VREF_A of the output transistor QP11 is not stable and can not be used. Thus, the output switch TSW12 is put in an off state.

In a period TI3, the output switch TSW12 is in an off state and VREF_A and VREF_B are in a disconnected state. Therefore, the state in the period TI3 is called a DISCONNECT state. When the period TI3 (=TI1+TI4) is started after VREF_A becomes stable, the transfer switch TSW12 is turned on. By turning on the transfer switch TSW12, VREF_A and VREF_B are connected to each other. Because they are connected, the state in a period TI5 is called a CONNECT state. Immediately after the transfer switch TSW12 is turned on, the potential of VREF_B is slightly changed. However, since VREF_A is stable, the potential of VREF_B is returned to a desired level (1.2V).

During the period TI5, the reference potential generating circuit generates a desired reference potential so that a predetermined refresh operation is performed. When the period TI5 elapses and the predetermined refresh operation is completed, both of the current switch signal SW11 and the output switch signal SW12 change to the VSS level. Therefore, the current switches QN11 and QN12 and the output switch (transfer switch) TSW12 are turned off. The reference potential generating circuit stops the operation and no current flows.

Hereinabove, description has been made about the current mirror amplifier CM11 to VREF_B of the first-stage reference potential generating circuit. In FIG. 2, the current mirror amplifier CM12 to VREF_D of the second-stage reference potential generating circuit are equivalent to the corresponding components and signals in the first-stage reference potential generating circuit although the names of the components and the signals are changed. For example, the current mirror amplifier CM11 is changed to CM12 and the input reference potential VREF_0 is changed to VREF_B. Further, by replacing SW11 with SW13, VREF_A with VREF_C, SW12 with SW14, and VREF_B with VREF_D in the timing chart in FIG. 3, an operation of the second-stage reference potential generating circuit will be understood. Therefore, detailed description thereof will be omitted herein.

It is assumed here that a resistance ratio of the monitoring resistances R11 and R12 is selected as 1:1 and a resistance ratio of R13 and R14 is selected as 1:4. In case where the input reference potential VREF_0 is equal to 0.6V, each of VREF_A and VREF_B is equal to 1.2V and each of VREF_C and VREF_D is equal to 1.5V. Thus, a desired reference potential can be generated by selecting the monitoring resistance ratio. Although VREF_A is connected to the input reference potential VREF_B of the second-stage reference potential generating circuit through the output switch TSW12 in the foregoing description, VREF_A may be connected to another circuit through another output switch.

Thus, a cycle T0 includes the STOP period TI1 in which no electric current flows through the reference potential generating circuit and the ACTIVE period TI2 in which an electric current flows through the reference potential generating circuit. Further, the ACTIVE period TI2 includes the period TI4 in which the output reference potential is unstable and is not transmitted to a next stage and the period TI5 in which the output reference potential is transmitted to the next stage. In the period TI5, the refresh operation is performed. The cycle T0 is controlled, for example, by a timer signal from the self-refreshing timer circuit 101 and the STOP period TI1, the ACTIVE period TI2, and the periods TI4 and TI5 are controlled by a signal from the control portion 100.

For simplification of description, it is assumed that a time ratio of the STOP period TI1 and the ACTIVE period TI2 is selected as 1:1. Then, current consumption of the entire reference potential generating circuit is reduced to a half. In case where the total current consumption is equal to 30 µA, the total current consumption is decreased to 15 µA and reduction by 15 µA can be achieved. In case where the DC current required in the entire mobile DRAM is approximately 60 to 100 µA in total as mentioned above, it is possible according to the present embodiment to reduce a total value of the DC current required in the entire mobile DRAM to approximately 30 to 50 µA which is a half or less of the above-mentioned value. In addition, the ratio of the STOP period can be further increased, so that the electric current can be reduced further. As a more practical example, the cycle T0 as the refresh cycle is set to about 50 µS at normal or room temperature in a range between 25 to 45° C. The STOP period TI1 in which no electric current flows through the reference potential generating circuit is set to about 46 µS. The period TI2 in which an electric current flows through the reference potential generating circuit is set to about 4 µS. The period TI4 required before the reference potential generating circuit becomes stable is less dependent on temperature and set to about 2 µS. The period TI5 is set to about 2 µS in consideration of a refresh operation time and a setup time and a hold time before or after the refresh operation time. Thus, the DC current can remarkably be reduced. Further, the above-mentioned control may be performed not only in the self-refresh operation period but also in any desired period. However, a remarkable effect is obtained in the self-refresh operation period. This is because the electric current of the self-refresh operation has a small value, i.e., on the order of several hundreds µA and because, in the mobile apparatus, a standby period is long and the self-refresh operation period occupies the most part of time.

In addition, in a temperature zone between a low temperature and a normal or room temperature (approximately −25 to 45° C.), a refresh interval of the self-refresh operation is long, so that a DC current reduction effect is remarkable. Therefore, it is proposed to perform the control according to the present invention only in the above-mentioned temperature zone. In a high temperature zone, the refresh interval of the self-refresh operation is short even if the reference potential generating circuit is continuously turned on. Therefore, the DC current is relatively decreased due to increase of AC current components.

In the control according to the present invention, the control portion 100 generates the control signal in response to the signal supplied from the cycle generating circuit 101. As the cycle generating circuit 101, use may be made of an output of the timer circuit in the DRAM, which is used in the self-refresh operation. In this event, it is possible to avoid overhead, such as cost for provision of an additional timer. For example, by frequency-dividing the output of the timer circuit, necessary on and off times can be obtained.

Second Embodiment

Next, referring to the drawing, a second embodiment of the present invention will be described in detail.

Figure 4:
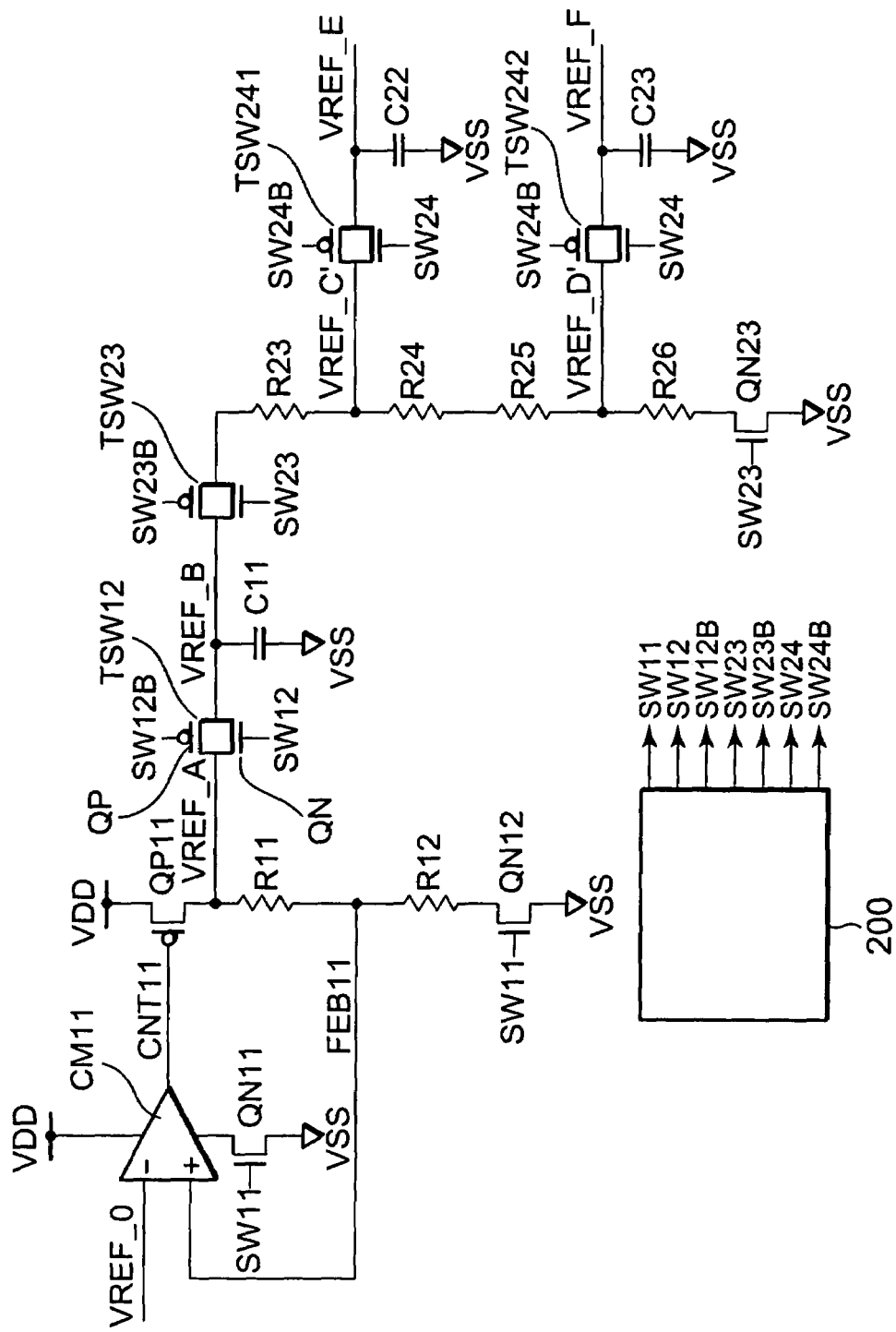
FIG. 4 is a view showing a DC current reduction-type reference potential generating circuit according to a second embodiment of the present invention.

Referring to FIG. 4, a DC current reduction-type reference potential generating circuit according to the second embodiment of the present invention will be described. The DC current reduction-type reference potential generating circuit is used in a semiconductor memory device. In the present embodiment, a plurality of output reference potentials VREF_C' and VREF_D' are further generated from an input reference potential VREF_B by resistance division. The DC current reduction-type reference potential generating circuit includes a first-stage reference potential generating circuit comprising CM11, QP11, R11, R12, QN11, QN12, TSW12, and soon, like in FIG. 2. In the DC current reduction-type reference potential generating circuit in FIG. 4, resistance elements R23, R24, R25, and R26 are used in a second-stage reference potential generating circuit instead of CM12, QP12, R13, and R14 in the second-stage reference potential generating circuit in FIG. 2. Further, in the second-stage reference potential generating circuit in FIG. 4, a transfer switch TSW23 and an N-channel transistor QN23 are used as current switches instead of the current switches QN13 and QN14 in FIG. 2.

VREF_B is supplied to R23 through the transfer switch (current switch) TSW23. To R23, R24, R25, and R26 are sequentially connected in series. R26 is connected to VSS through the current switch QN23. The output reference potential VREF_C' at a connection point of R23 and R24 is transmitted through a transfer switch (output switch) TSW241 to a next stage as VREF_E. A capacitance element C22 for voltage stabilization is connected between VREF_E and VSS. The output reference potential VREF_D' at a connection point of R25 and R26 is transmitted through a transfer switch (output switch) TSW242 to a next stage as VREF_F. A capacitance element C23 for voltage stabilization is connected between VREF_F and VSS.

Like the control portion 100 in FIG. 2, a control portion 200 produces a current switch signal SW11 and output switch signals SW12 and SW12B in response to a refresh command supplied from a self-refreshing timer circuit (not shown in FIG. 4) as a cycle generating circuit. The control portion 200 further produces current switch signals SW23 and SW23B and output switch signals SW24 and SW24B. The current switch signal SW23B is an inversion signal of the current switch signal SW23. The output switch signal SW24B is an inversion signal of the output switch signal SW24.

Figure 5:
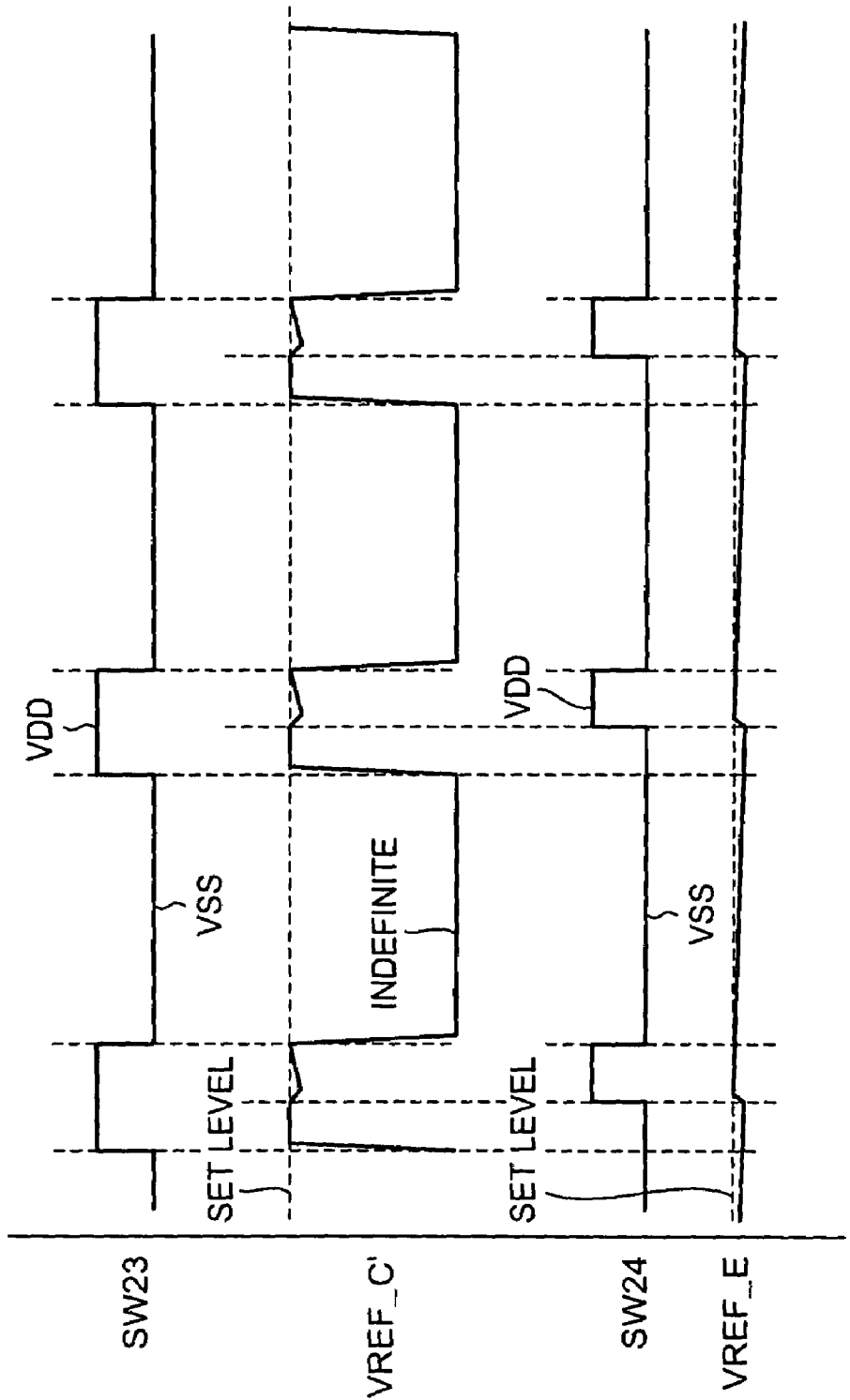
FIG. 5 is a timing chart for describing an operation of a second-stage reference potential generating circuit of the DC current reduction-type reference potential generating circuit in FIG. 4.

FIG. 5 is a timing chart of the second-stage reference potential generating circuit in FIG. 4. In FIG. 5, waveforms of SW23, VREF_C', SW24, and VREF_E are shown.

In FIGS. 4 and 5, an operation flow until the current mirror amplifier CM11 and the output transistor QP11 produce VREF_A in the first-stage reference potential generating circuit is the same as that of the first embodiment in FIG. 2. The reference potential VREF_A generated by the current mirror amplifier CM11 and the output transistor QP11 becomes VREF_B. In the second-stage reference potential generating circuit, VREF_C' and VREF_D' are generated on the basis of VREF_B.

In the second-stage reference potential generating circuit, the current switch signal SW23 is supplied to a gate of an N-channel transistor of the transfer switch TSW23. The current switch signal SW23B is supplied to a gate of a P-channel transistor of the transfer switch TSW23. The current switch signal SW23 is further supplied to a gate of the current switch (N-channel transistor) QN23.

The output switch signal SW24 is supplied to gates of N-channel transistors of the transfer switches TSW241 and TSW242. The output switch signal SW24B is supplied to gates of P-channel transistors of the transfer switches TSW241 and TSW242.

As shown in FIG. 5, when the current switch signal SW23 is decreased in level to VSS (current switch signal SW23B is increased in level to VDD), the transfer switch (current switch) TSW23 and the current switch QN23 are turned off. At the timing when the current switch signal SW23 is decreased in level to VSS, the output switch signal SW24 is simultaneously decreased to VSS also (that is, the output switch signal SW24B is increased in level to VDD). Thus, the transfer switches (output switches) TSW241 and 242 are also turned off.

Thereafter, an electric current flowing through the resistance elements R23, R24, R25, and R26 stops and each node of the resistance elements has the same potential (indefinite or undefined level at VREF_C' in FIG. 5). Although VREF_C' alone is shown in FIG. 5, VREF_C' and VREF_D' have the same potential (above-mentioned indefinite level) in this case. In FIG. 5, the indefinite level is lower than a set level. An absolute value of the indefinite level is determined by the potential of each node of the resistance elements before the electric current stops and the value of a parasitic capacitance at each node. Further, the absolute value of the indefinite level is determined by a capacitance ratio or the like in case where capacitance coupling occurs.

In the manner similar to that described in connection with FIG. 3, at a time instant when the current switches TSW23 and QN23 are turned on, VREF_E and VREF_F are decreased from an initial value (set level) by a particular value due to weak current leak. Before the amount of change exceeds a predetermined amount, SW23 is increased to VDD and TSW23 and QN23 are turned on. At a time instant when the output switches TSW241 and TSW242 are turned on, VREF_E and VREF_F are further decreased. However, the decrease of VREF_E and VREF_F is small and causes no problem.

Like in case of FIG. 3, the control portion 200 performs control as follows. The output switches TSW241 and TSW242 are not turned on at the same time as the current switches TSW23 and QN23 are turned on (ACTIVE). After VREF_C' and VREF_D' become stable at a set level, TSW241 and TSW242 are turned on. Immediately after TSW241 and TSW242 are turned on, VREF_E and VREF_F are coupled with the capacitance elements C22 and C23 and changed in potential. However, the amount of change is sufficiently small and is negligible. Thereafter, C22 and C23 are supplied with electric charges through resistance elements R23, R24, R25, and R26, so that the potential transits to the set level with accuracy.

In a standby state of the mobile apparatus, the reference potential generating circuit of the present invention is put into a STOP state in which the current switches and the output switches are turned off to thereby reduce current consumption. Upon performing the refresh operation, the current switches are first turned on to put the reference potential generating circuit into an ACTIVE state and it is waited for the output potential to become stable. At a time instant when the output potential becomes stable, the output switches are turned on to produce the potential. At a time instant when the stable potential is supplied, the refresh operation is performed. Thus, it is possible to obtain the reference potential generating circuit capable of reducing current consumption in a standby state and obtaining a stable reference potential upon the refresh operation.

Hereinbefore, the first and the second embodiments of the present invention have been described. However, the present invention is not limited to these embodiments. The present invention is applicable not only to the reference potential generating circuit having a two-stage structure as the embodiments shown in FIGS. 2 and 4 but also to a reference potential generating circuit having a one-stage structure.

The semiconductor memory device of the present invention may be mounted to a mobile phone and a mobile digital apparatus.

What is claimed is:

1. A reference potential generating circuit supplied with an input reference potential for generating an output reference potential, said circuit comprising a current mirror amplifier supplied with said input reference potential and a feedback level, an output transistor supplied with an output of said current mirror amplifier as an input for producing said output reference potential as an output, a monitoring portion for generating said feedback level from the output of said output transistor, a first switch for controlling power supply to said current mirror amplifier, a second switch for controlling power supply to said monitoring portion, and an output switch for controlling connection of the output of said output transistor to a next stage, said first and said second switches and said output switch being simultaneously turned off, said first and said second switches being turned on when a first predetermined period elapses after said first, said second, and said output switches are turned off, said output switch being turned on when a second predetermined period elapses after said first and said second switches are turned on.

2. The reference potential generating circuit as claimed in claim 1, wherein said monitoring portion has a plurality of resistance elements connected in series and is for generating said feedback level at a resistance division point by said resistance elements, said first and said second switches comprising transistors, respectively, said output switch comprising a transfer switch.

3. The reference potential generating circuit as claimed in claim 1, wherein said first switch is for controlling supply of the ground potential to said current mirror amplifier and said second switch is for controlling supply of the ground potential to said monitoring portion.

4. The reference potential generating circuit as claimed in claim 1, wherein said second predetermined period includes a period from a time instant when said first and said second switches are turned on to a time instant when ringing caused in the output of said output transistor by said current mirror amplifier converges and the output of said output transistor becomes stable.

5. The reference potential generating circuit as claimed in claim 1, further comprising a control portion for controlling said first and said second switches and said output switch, said control portion repeatedly performing an operation of simultaneously turning off said first and said second switches and said output switch in a predetermined cycle, said control portion turning on said first and said second switches in each predetermined cycle after lapse of said first predetermined period from a time instant when said first and said second switches and said output switch are simultaneously turned off, said control portion turning on said output switch after lapse of said second predetermined period from a time instant when said first and said second switches are turned on, and keeping said first and said second switches and said output switch in an on state during a third predetermined period after said output switch is turned on and before said first and said second switches and said output switch are simultaneously turned off next time.

6. The reference potential generating circuit as claimed in claim 1, further comprising a subsequent-stage reference potential generating circuit supplied with said output reference potential as a subsequent-stage input reference potential for generating a subsequent-stage output reference potential, said subsequent-stage reference potential generating circuit comprising a resistance dividing portion for dividing a potential between said subsequent-stage input reference potential and a power supply potential by a plurality of resistances to generate said subsequent-stage output reference potential, a third switch for controlling supply of said subsequent-stage input reference potential to said resistance dividing portion, a fourth switch for controlling supply of said power supply potential to said resistance dividing portion, and a fifth switch for controlling connection of said subsequent-stage output reference potential of said resistance dividing portion to a next stage, said third through said fifth switches being simultaneously turned off, said third and said fourth switches being turned on when said first predetermined period elapses after said third through said fifth switches are simultaneously turned off, said fifth switch being turned on when said second predetermined period elapses after said third and said fourth switches are turned on.

7. The reference potential generating circuit as claimed in claim 6, wherein each of said third and said fifth switches comprises a transfer switch, said fourth switch comprising a transistor.

8. The reference potential generating circuit as claimed in claim 6, wherein said fourth switch is for controlling supply of the ground potential to said resistance dividing portion.

9. A semiconductor memory device comprising the reference potential generating circuit claimed in claim 1.

10. A semiconductor memory device comprising the reference potential generating circuit claimed in claim 5, said semiconductor memory device further comprising a self-refreshing timer circuit for generating a refresh command in a self-refresh cycle, said control portion being connected to said self-refreshing timer circuit and determining said predetermined cycle on the basis of the refresh command supplied from said self-refreshing timer circuit.

11. The semiconductor memory device as claimed in claim 10, wherein said control portion further determines said first through said third predetermined periods on the basis of the refresh command.

12. The semiconductor memory device as claimed in claim 10, wherein a self-refresh operation is performed in said third predetermined period.

13. A semiconductor memory device comprising the reference potential generating circuit claimed in claim 2.

14. A semiconductor memory device comprising the reference potential generating circuit claimed claim 3.

15. A semiconductor memory device comprising the reference potential generating circuit claimed in claim 4.

16. A semiconductor memory device comprising the reference potential generating circuit claimed in claim 5.

17. A semiconductor memory device comprising the reference potential generating circuit claimed in claim 6.

18. A semiconductor memory device comprising the reference potential generating circuit claimed in claim 7.

19. A semiconductor memory device comprising the reference potential generating circuit claimed in claim 8.

* * * * *